(12) United States Patent
Aoyama

(10) Patent No.: US 10,567,692 B2
(45) Date of Patent: Feb. 18, 2020

(54) IMAGE CAPTURING APPARATUS, IMAGING CAPTURING SYSTEM, SIGNAL PROCESSING APPARATUS, AND SIGNAL PROCESSING METHOD

(71) Applicant: CANON KABUSHIKI KAISHA, Tokyo (JP)

(72) Inventor: Eiki Aoyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/218,767

(22) Filed: Dec. 13, 2018

(65) Prior Publication Data

US 2019/0199953 A1 Jun. 27, 2019

(30) Foreign Application Priority Data

Dec. 22, 2017 (JP) ................................ 2017-246405

(51) Int. Cl.
*H04N 5/378* (2011.01)
*H03M 13/00* (2006.01)
(Continued)

(52) U.S. Cl.
CPC ....... *H04N 5/378* (2013.01); *H01L 27/14605* (2013.01); *H03K 19/21* (2013.01);
(Continued)

(58) Field of Classification Search
CPC ... H04N 5/37455; H04N 5/378; H03M 13/00; H03M 13/2942; H03M 13/61;
(Continued)

(56) References Cited

U.S. PATENT DOCUMENTS

| 5,724,391 A | * | 3/1998 | Takeuchi | ................ H04L 1/004 341/67 |
| 7,209,170 B2 | * | 4/2007 | Nishino | ............... H04N 5/2354 250/208.1 |

(Continued)

FOREIGN PATENT DOCUMENTS

| JP | H04-284541 A | 10/1992 |
| JP | 2010-068414 A | 3/2010 |

(Continued)

OTHER PUBLICATIONS

Office Action dated Oct. 25, 2019, in Japanese Patent Application No. 2017-246405.

*Primary Examiner* — Lin Ye
*Assistant Examiner* — Chriss S Yoder, III
(74) *Attorney, Agent, or Firm* — Venable LLP

(57) ABSTRACT

An image capturing apparatus including a pixel region in which a plurality of pixels are arranged in a matrix, an A/D converter configured to convert a plurality of signals output from the plurality of pixels into a plurality of corresponding digital data, and a signal processing unit configured to generate an error-correcting code for the plurality of digital data, wherein, in the generating the error-correcting code, the signal processing unit performs grouping the plurality of digital data output from the A/D converter into a plurality of groups, and wherein the signal processing unit performs the grouping so that, in each of the plurality of groups, a total data length of the digital data forming corresponding one of the plurality of groups is not shorter than a length of the error-correcting code.

15 Claims, 18 Drawing Sheets

(51) Int. Cl.
 H04L 1/00 (2006.01)
 H04N 5/3745 (2011.01)
 H01L 27/146 (2006.01)
 H03K 19/21 (2006.01)

(52) U.S. Cl.
 CPC .......... H03M 13/61 (2013.01); H04L 1/0083 (2013.01); H04L 1/0084 (2013.01); H04N 5/37455 (2013.01)

(58) Field of Classification Search
 CPC ............. H03M 13/615; H03M 13/616; H03M 13/617; H04L 1/0006; H04L 1/0083; H04L 1/0084; H04L 1/0091; H01L 27/14605; H03K 19/21
 See application file for complete search history.

(56) References Cited

U.S. PATENT DOCUMENTS

| | | | | |
|---|---|---|---|---|
| 7,773,126 B1* | 8/2010 | Lee | ...................... | H04N 1/2112 348/159 |
| 7,859,581 B2* | 12/2010 | Guidash | ............... | H04N 3/1562 348/302 |
| 8,970,750 B2* | 3/2015 | Sugioka | ................ | G06T 1/0007 348/294 |
| 2012/0120287 A1* | 5/2012 | Funamoto | .............. | H04N 5/335 348/246 |

FOREIGN PATENT DOCUMENTS

| | | |
|---|---|---|
| JP | 2010-283504 A | 12/2010 |
| JP | 2012-105188 A | 5/2012 |
| JP | 2012-120159 A | 6/2012 |

* cited by examiner

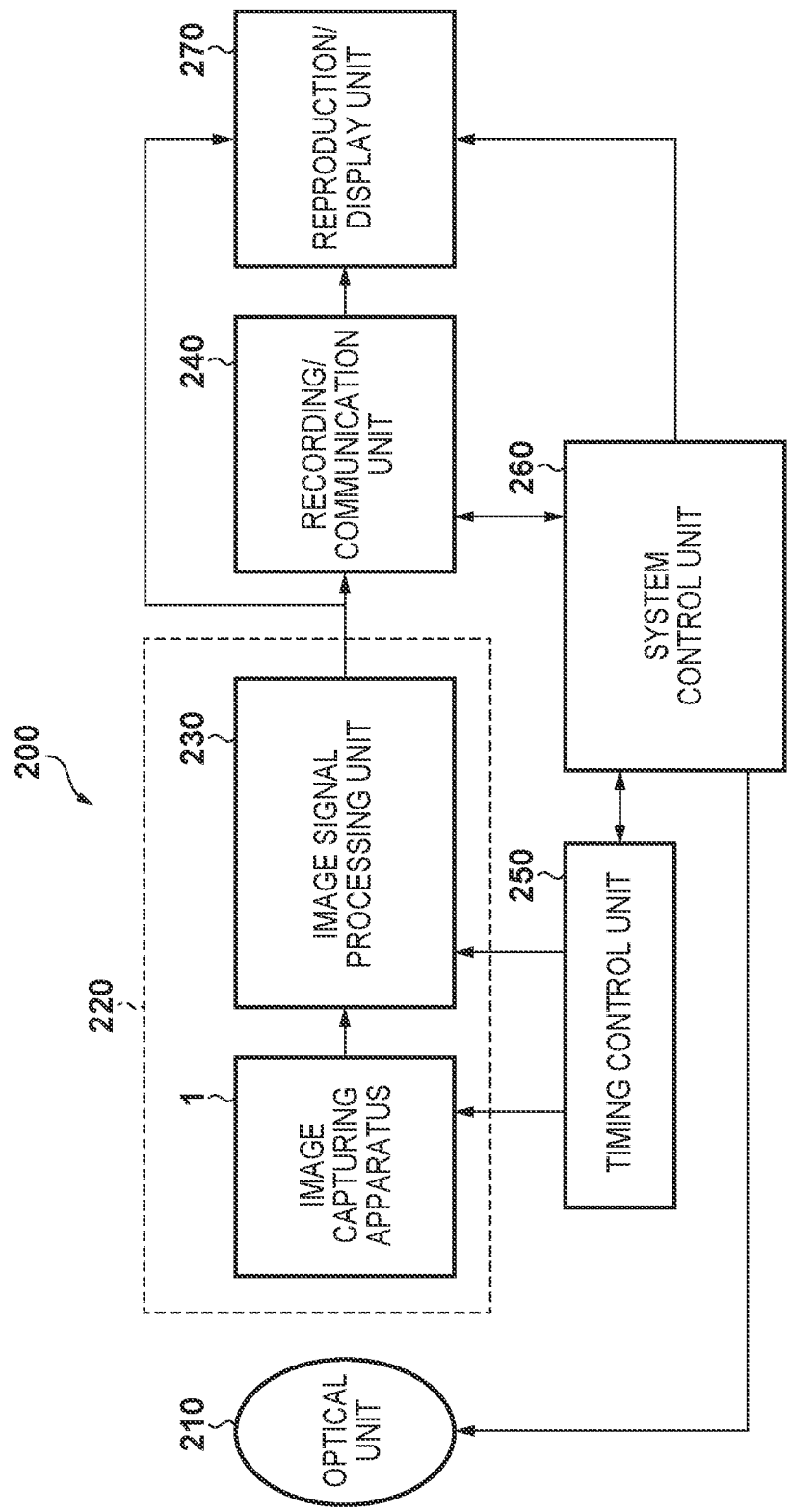

IMAGE CAPTURING APPARATUS, IMAGING CAPTURING SYSTEM, SIGNAL PROCESSING APPARATUS, AND SIGNAL PROCESSING METHOD

BACKGROUND OF THE INVENTION

Field of the Invention

The present invention relates to an image capturing apparatus including error correction processing, an image capturing system, a signal processing apparatus, and a signal processing method.

Description of the Related Art

In recent years, while the number of pixels of an image capturing apparatus increases, it has been desired to drive the image capturing apparatus at high speed to capture a high-speed object. Thus, the image capturing apparatus outputs a large amount of data at high speed. It is known that when transmitting a signal at high speed, data is readily destroyed by noise. To cope with this, some recent image capturing apparatuses add an error-correcting code to an output signal. Japanese Patent Laid-Open No. 2012-120159 discloses a method of adding an error-correcting code in an image capturing apparatus. Furthermore, Japanese Patent Laid-Open No. 4-284541 discloses a technique of reading out data parallelly, and performing error correction processing for the data readout parallelly.

However, when generating an error-correcting code from pixel data, if the code length of the error-correcting code to be generated and the length of data for which the error-correcting code is to be generated have a predetermined relationship, it may be impossible to generate the error-correcting code.

SUMMARY OF THE INVENTION

The present invention has been made in consideration of the above situation, and provides a technique advantageous in generating an error-correcting code for pixel data.

According to an aspect of the present invention, the present invention provides an image capturing apparatus including a pixel region in which a plurality of pixels are arranged in a matrix, an A/D converter configured to convert a plurality of signals output from the plurality of pixels into a plurality of corresponding digital data, and a signal processing unit configured to generate an error-correcting code for the plurality of digital data, wherein, in the generating the error-correcting code, the signal processing unit performs grouping the plurality of digital data output from the A/D converter into a plurality of groups, and wherein the signal processing unit performs the grouping so that, in each of the plurality of groups, a total data length of the digital data forming corresponding one of the plurality of groups is not shorter than a length of the error-correcting code.

Further features of the present invention will become apparent from the following description of exemplary embodiments with reference to the attached drawings.

BRIEF DESCRIPTION OF THE DRAWINGS

FIG. 19 is a block diagram showing an image capturing system according to the embodiments.

DESCRIPTION OF THE EMBODIMENTS

First Embodiment

Figure 1:
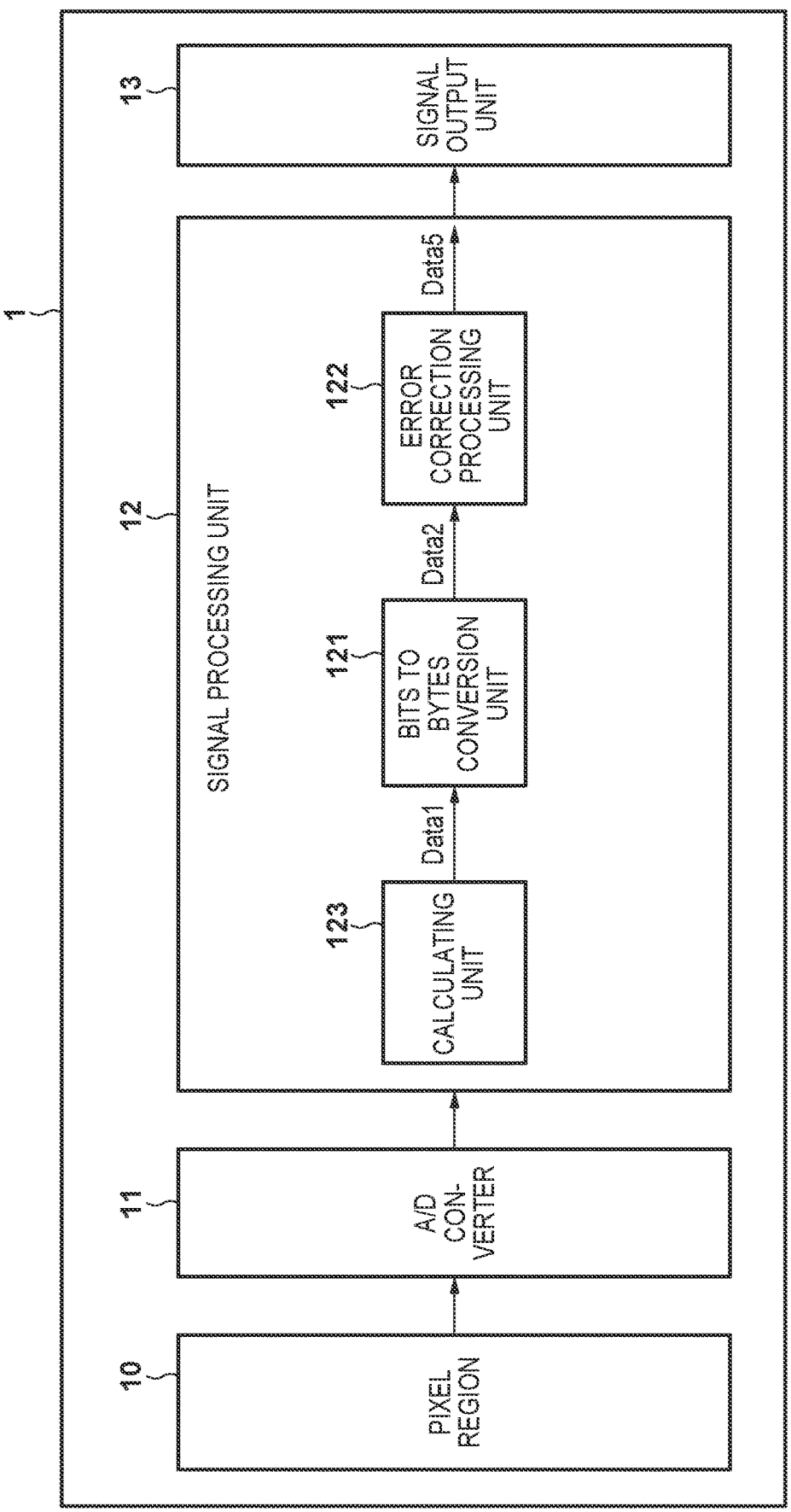
FIG. 1 is a block diagram showing an image capturing apparatus 1 according to the first embodiment.

FIG. 1 is a block diagram showing an image capturing apparatus 1 for carrying out the present invention. In a pixel region 10, a plurality of pixels each including a photoelectric conversion element are arranged in a matrix. Pixel data as analog data output from the pixel region 10 are converted into digital data in an A/D converter 11. The digital data output from the A/D converter 11 undergo calculating processing for signal values in a calculating unit 123 of a signal processing unit 12. The signal processing unit 12 includes a bits to bytes conversion unit 121 and an error correction processing unit 122. The bits to bytes conversion unit 121 performs processing of converting input Data1 into data in a predetermined unit, for example, units of bytes, and outputs the data as Data2. The error correction processing unit 122 generates an error-correcting code for Data2. The error-correcting code generated by the error correction processing unit 122 is output, as Data5, from the error correction processing unit 122 together with digital data of an image. Data5 is output from the signal processing unit 12, and output from the image capturing apparatus 1 via a signal output unit 13.

Figure 2:
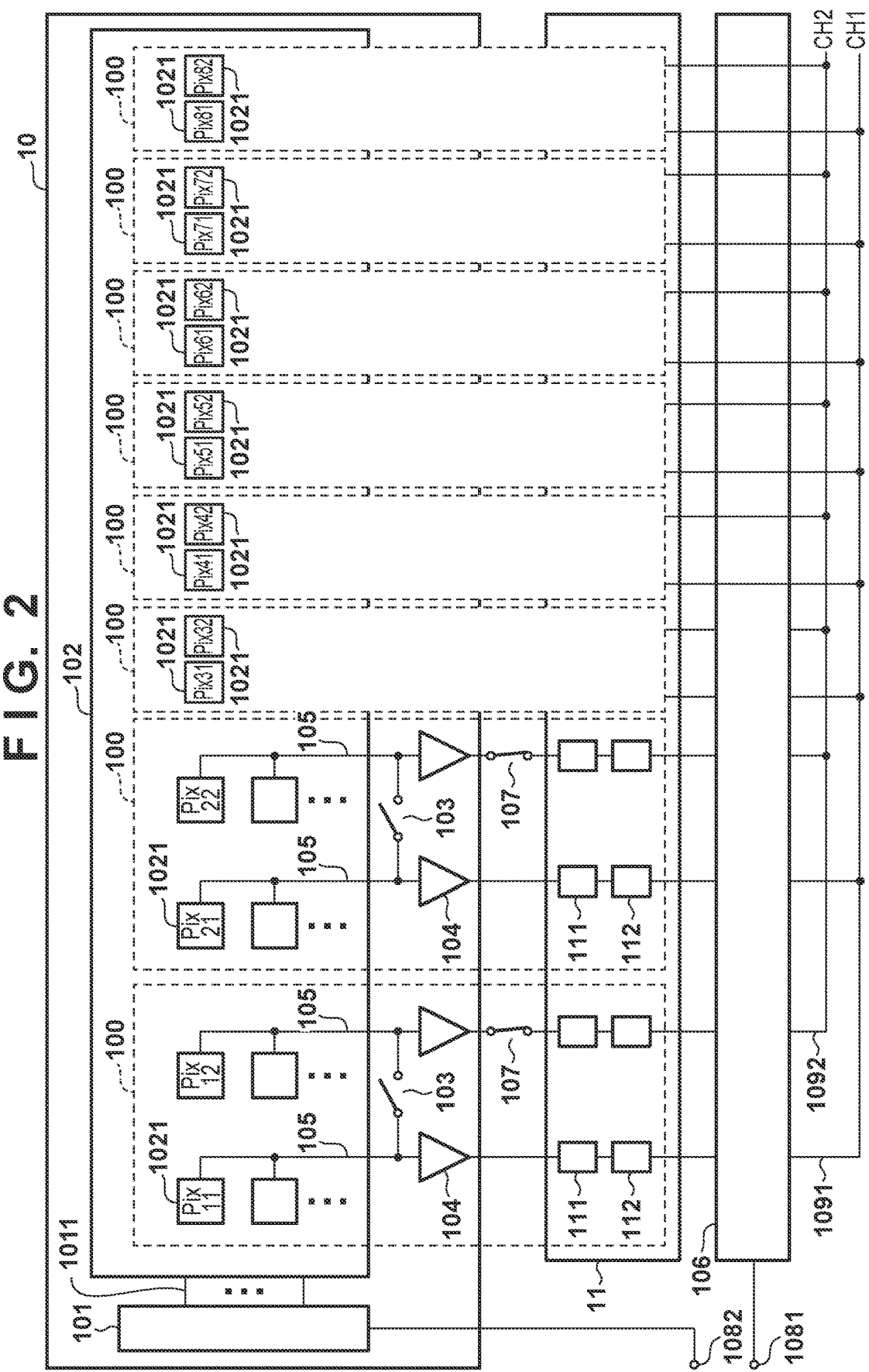
FIG. 2 is a block diagram showing a pixel region 10, an A/D converter 11, and a circuit around them according to the first embodiment.

FIG. 2 shows the arrangements of the pixel region 10 and A/D converter 11 of the image capturing apparatus 1. The pixel region 10 includes a vertical decoder 101, a pixel array 102, vertical output lines 105, switches 103, and amplifiers 104. FIG. 2 shows 16 pixels Pix11 to Pix82 arranged in a row for the sake of explanation. Pixels arranged in other rows are omitted. In fact, a large number of pixels are arranged in a matrix in the pixel region 10. Signals from pixels are read out by a readout circuit formed from the vertical decoder 101, row selection lines 1011, and the amplifiers 104, and output to the A/D converter 11. The vertical decoder 101 selects a row address designated by a row address signal line 1082. Data of pixels 1021 on the selected row are output from the amplifiers 104 to the A/D converter 11 via the vertical output lines 105. The A/D converter 11 includes A/D conversion execution units 111 and data holding units 112. Each signal input to the A/D converter 11 is converted into a digital signal in the A/D conversion execution unit 111, and held in the data holding unit 112. In this embodiment, a signal from one pixel is converted into a 14-bit digital signal. A column address signal line 1081 causes a horizontal decoder 106 to designate a specific column, and the digital data held in the data holding units 112 on the designated column are respectively output to horizontal output lines 1091 and 1092. This embodiment explains a case in which there are two horizontal output lines. The two horizontal output lines 1091 and 1092 will be referred to as CH1 and CH2, respectively, hereinafter. As shown in FIG. 2, an arrangement surrounded by a broken line 100 is repeatedly arranged side by side.

Figure 5:
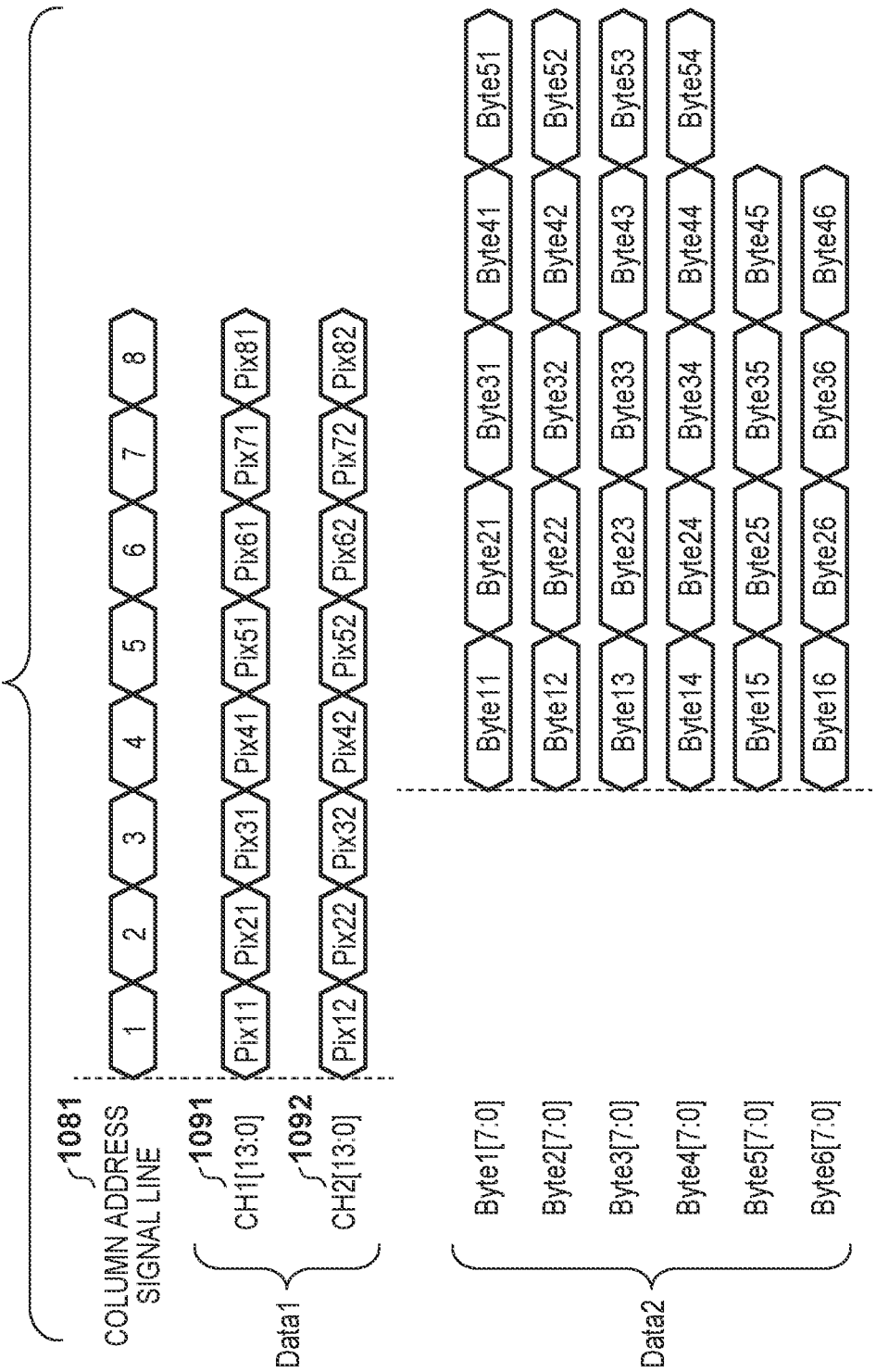
FIG. 5 is an example of a timing chart showing the operation of the bits to bytes conversion unit 121 according to the first embodiment.

In FIG. 2, as one of the readout methods of the pixel data of the pixel region 10, there is a full pixel readout mode as a method of reading out data of all the pixels 1021 of the pixel region 10. In this method, the signals of the pixels on the row selected by the vertical decoder 101 are A/D-converted and held in the data holding units 112 on the respective columns. The held digital data are respectively output to the horizontal output lines 1091 and 1092 on the column designated by the column address signal line 1081. In the example shown in FIG. 2, when the column address signal line 1081 is 1, the digital data corresponding to the signal of the pixel Pix11 is output to the horizontal output line 1091, and the digital data corresponding to the signal of the pixel Pix12 is output to the horizontal output line 1092. Similarly, when the column address signal line 1081 is 2, the digital data corresponding to the signal of the pixel Pix21 is output to the horizontal output line 1091, and the digital data corresponding to the signal of the pixel Pix22 is output to the horizontal output line 1092. FIG. 5 shows the relationship between the column address signal line 1081 and the data output to the horizontal output lines 1091 and 1092 at this time. As described above, it is possible to read out the data of all the pixels on the row selected by the row address signal line 1082 into the horizontal output lines 1091 and 1092 by scanning the column address signal line 1081. A case in which an error-correcting code is generated will be described below by exemplifying the full pixel readout mode.

Figure 3:
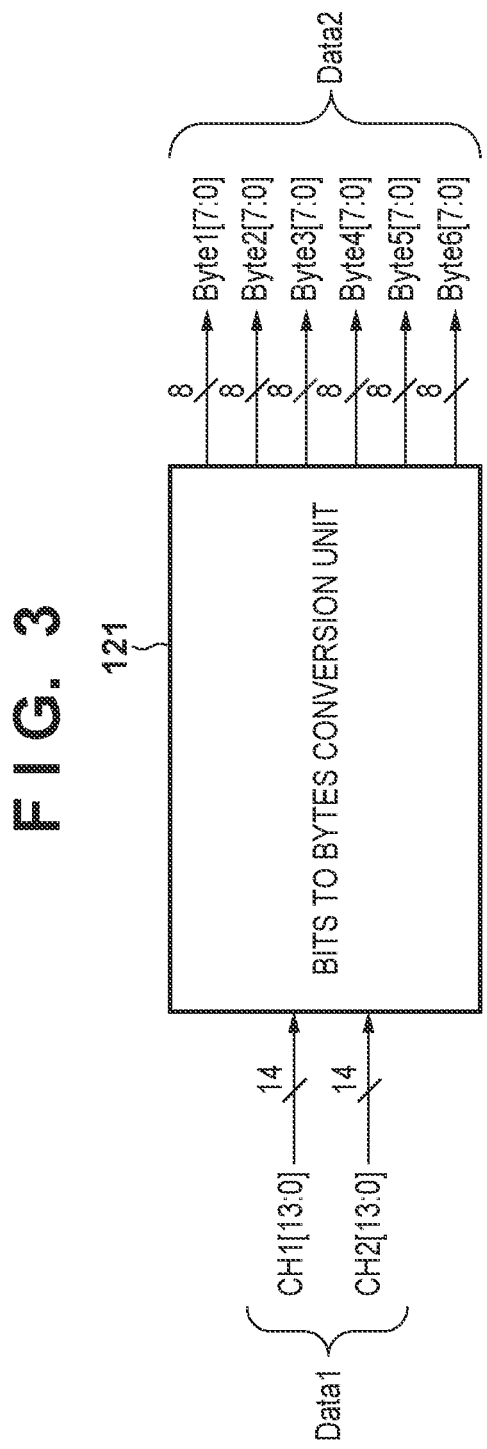
FIG. 3 is a block diagram showing a bits to bytes conversion unit 121 according to the first embodiment.

This embodiment will describe a case in which data processing is performed in units of bytes. The digital data from the A/D converter 11 are converted into data in units of bytes for processing. FIG. 3 shows the bits to bytes conversion unit 121. Data1 with 14 bits for each pixel is input to the bits to bytes conversion unit 121 via CH1 and CH2. When 1 byte is equal to 8 bits, the bits to bytes conversion unit 121 outputs Data2 in units of bytes based on Data1 with 14 bits as a unit. Although FIG. 3 shows, for the sake of descriptive convenience, a case in which the bits to bytes conversion unit 121 divides the data into six data in units of bytes, and outputs them, the bits to bytes conversion unit 121 may serially output the data in units of bytes.

Figure 4:
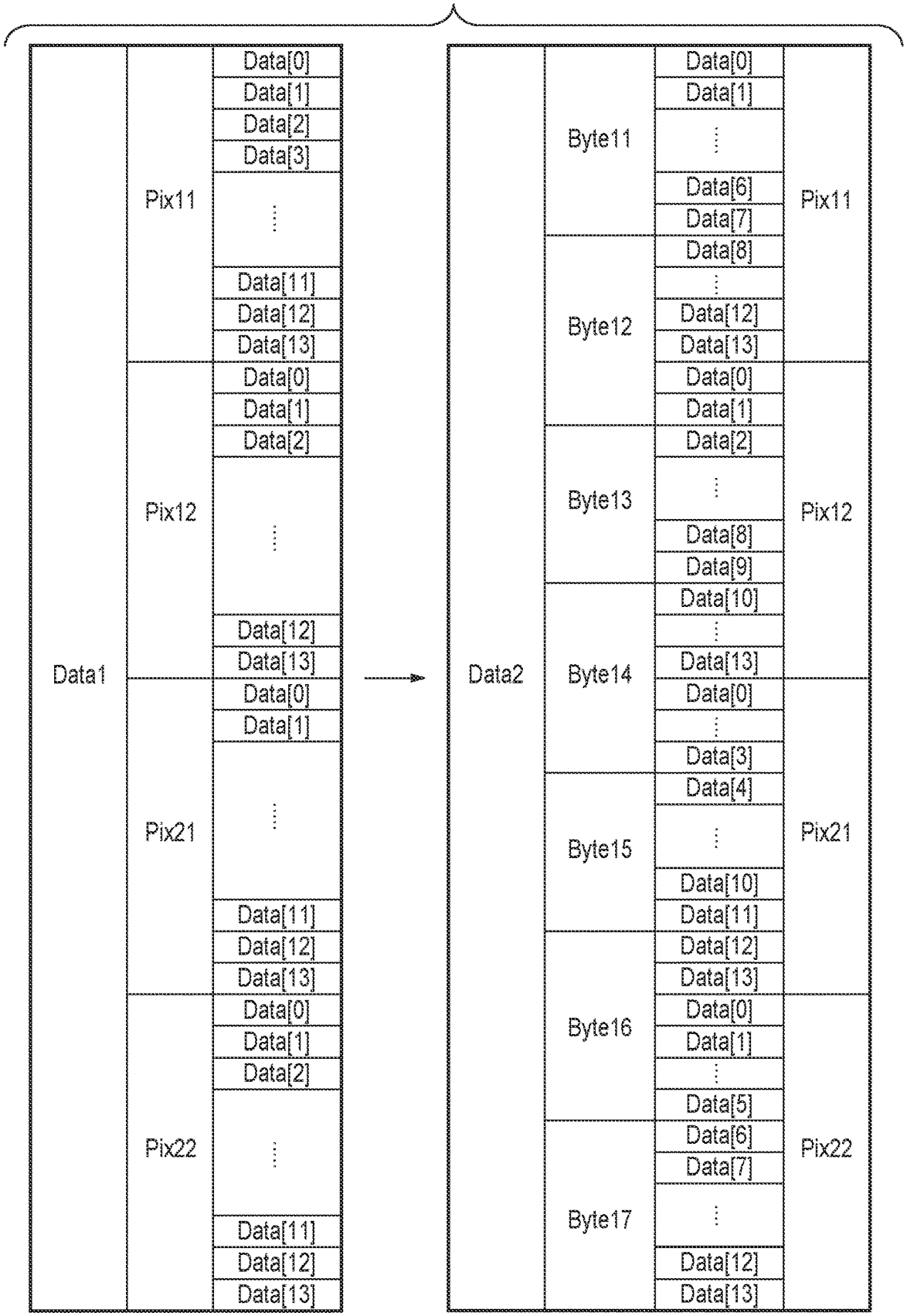
FIG. 4 is a view showing an example of the processing of the bits to bytes conversion unit 121 according to the first embodiment.

Generation of data in units of bytes in the bits to bytes conversion unit 121 will be described with reference to FIG. 4. FIG. 4 shows a case in which Data1 of four pixels (Pix11, Pix12, Pix21, and Pix22), that is, two pixels from each horizontal output line CH1 or CH2, is converted into Data2. Since data for each pixel includes 14 bits, Data1 of 56 bits in total is input to the bits to bytes conversion unit 121. The 56-bit data corresponds to 7 bytes. Therefore, in the example of FIG. 4, the data of the four pixels are converted into 7-byte Data2 formed from Byte11 to Byte17.

FIG. 5 is a timing chart when the signals of 16 pixels for one row indicated by Pix11 to Pix82 arranged in the pixel region 10 shown in FIG. 2 are input to the bits to bytes conversion unit 121. Data1 of the 16 pixels corresponds to 14 bits×16 pixels=224 bits. Therefore, Data1 is converted into Data2 of 28 bytes (28×8 bits=224 bits) in total, which is indicated by Byte11 to Byte54. Although one row of the pixel region 10 includes 16 pixels for the sake of explanation, more pixels are arranged in fact. A case in which an error-correcting code is generated for the data of one row of the pixel region 10 will be described below. However, an error-correcting code may be generated for data of one screen (one frame). The amount of data to which an error-correcting code is to be added can be arbitrarily determined. Note that FIG. 5 shows Data2 by grouping it into four 6-byte groups and one 4-byte group for the sake of descriptive convenience. FIG. 5 shows a case in which Byte11, Byte12, Byte13, Byte14, Byte15, and Byte16 form the first group of the data to which an error-correcting code is to be added, and Byte51, Byte52, Byte53, and Byte54 form the last group of the data to which the error-correcting code is to be added.

Figure 6:
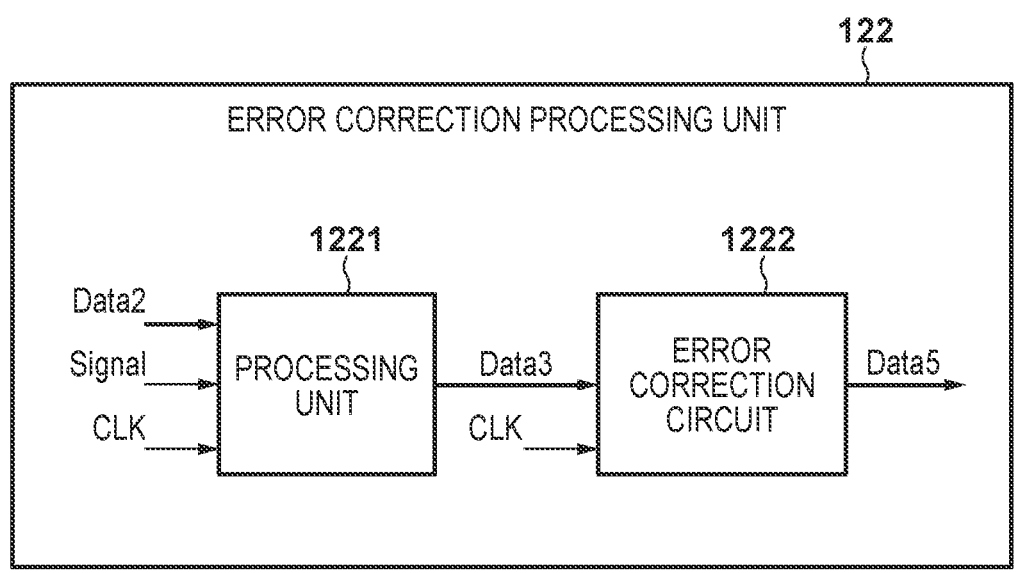
FIG. 6 is a block diagram showing an error correction processing unit 122 according to the first embodiment.
Figure 9:
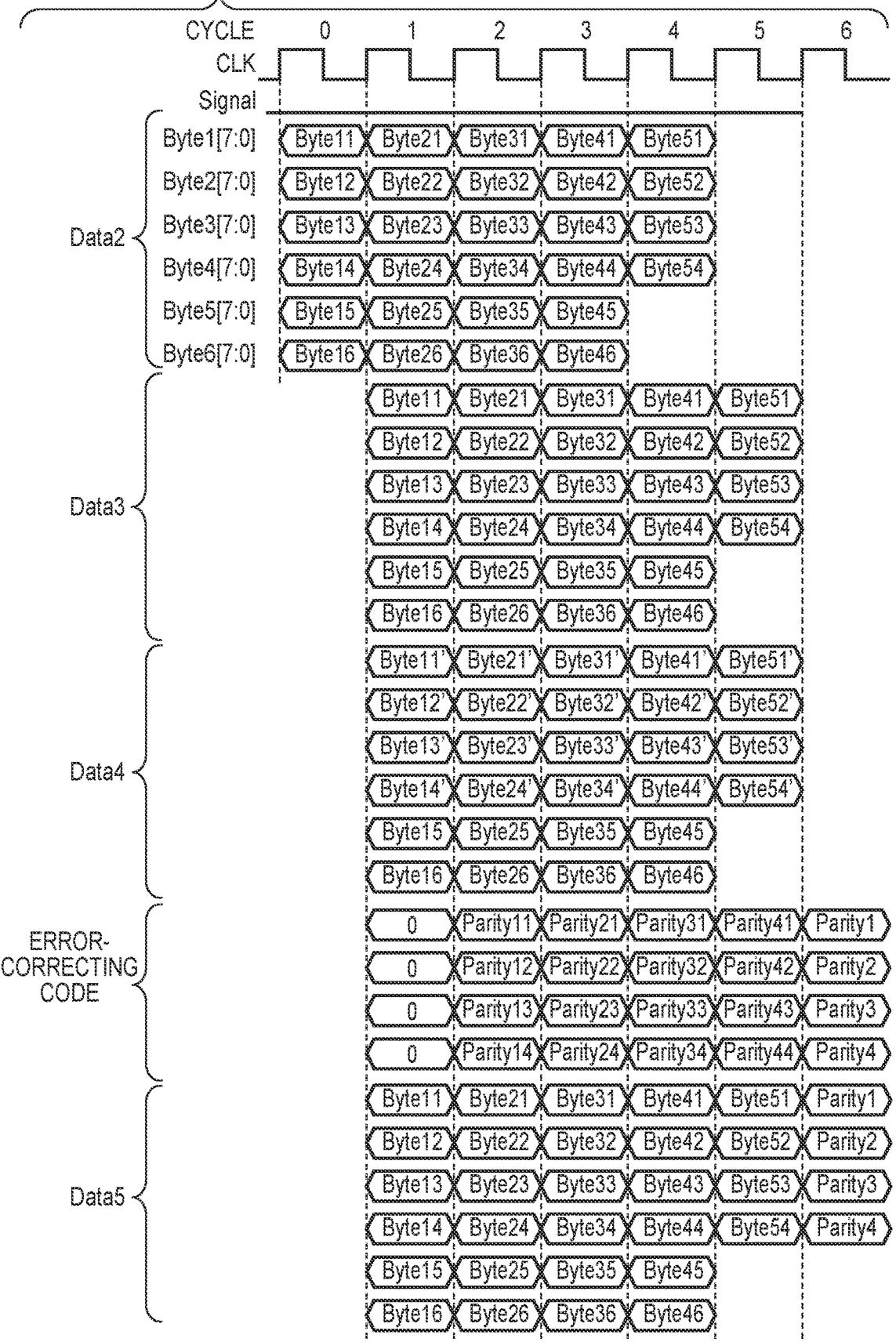
FIG. 9 is an example of a timing chart showing the operations of the processing unit 1221 and the error correction circuit 1222 according to the first embodiment.

FIG. 6 is a block diagram showing the error correction processing unit 122. A description will be provided by dividing the error correction processing unit 122 into a processing unit 1221 for executing processing before calculating an error-correcting code and an error correction circuit 1222 for calculating the error-correcting code. In the error correction processing unit 122, input Data2 is processed, as needed, thereby obtaining Data3. Calculation is performed to generate an error-correcting code by the error correction circuit 1222 for Data3. After generating the error-correcting code, Data3 and the error-correcting code as a calculation result are combined, and output as Data5. In this embodiment, the error correction circuit 1222 generates an error-correcting code by performing parallel processing for the data formed from the groups each including the plurality of data in units of bytes that are input parallelly. For this error-correcting code generation method, for example, the method disclosed in Japanese Patent Laid-Open No. 4-284541 can be used. As an error-correcting code, a code of a predetermined length can be added to data of an arbitrary length. For example, if a 4-byte error-correcting code is added to 28-byte data, the 4-byte error-correcting code is added to the end of the 28-byte data. FIG. 9 shows a case in which a 4-byte error-correcting code of Parity1 to Parity4 is added to the 28-byte data of Byte11 to Byte54 of Data2, as indicted by Data5. Error correction capability for the data to which an error-correcting code is to be added is determined in accordance with the length (to be referred to as an error-correcting code length hereinafter) of the error-correcting code. Therefore, the length of data as an error correction target and the error-correcting code length are determined in accordance with desired error correction capability.

Figure 7:
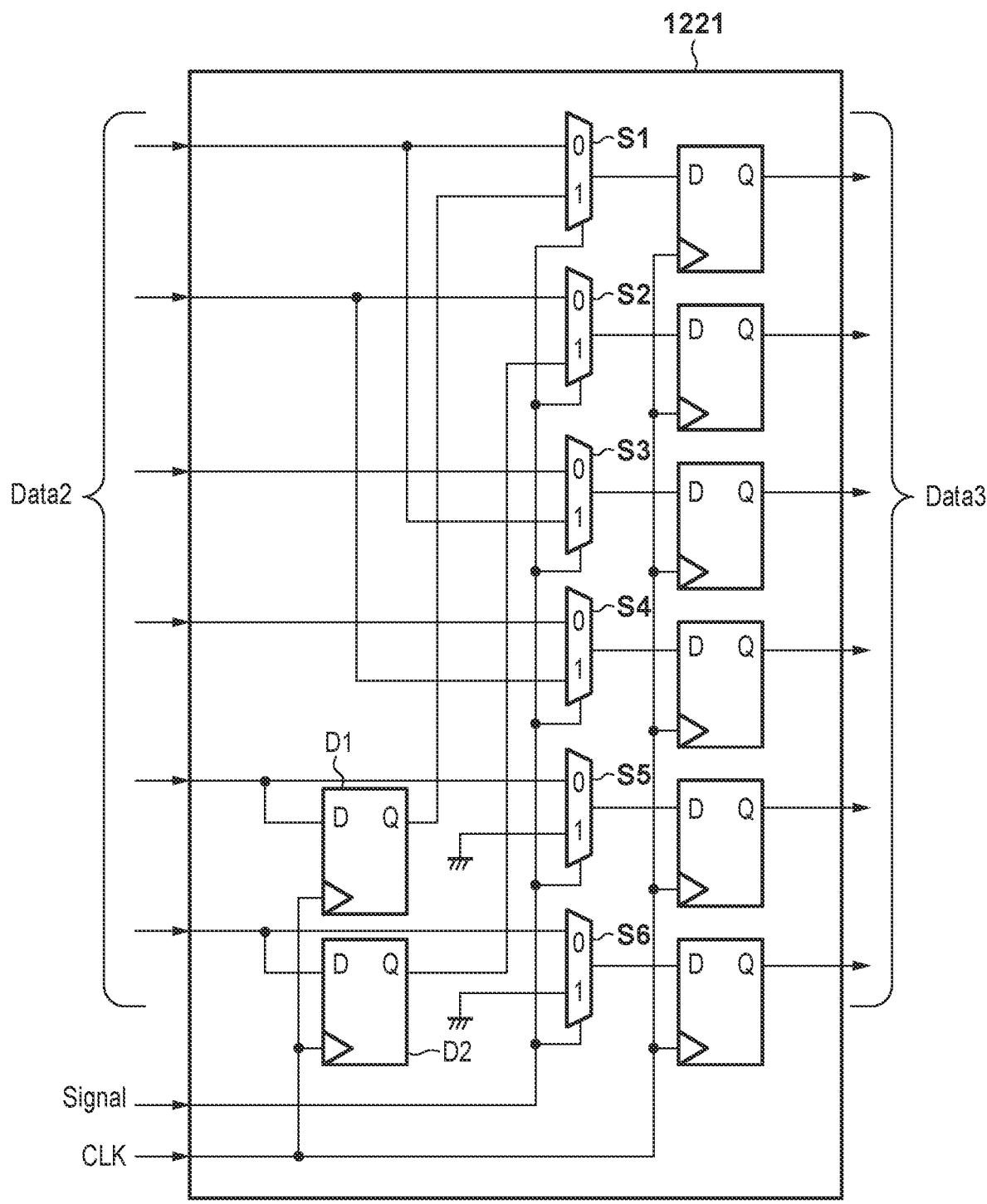
FIG. 7 is a circuit diagram showing the processing unit 1221 according to the first embodiment.

FIG. 7 shows an example of the processing unit 1221 when it is formed by hardware. Assume that the data of Data2 are input parallelly in units of bytes. Note that FIG. 7 does not show details of the input of the data in units of bytes. Data2 is input to 2-input 1-output selection circuits S1 to S6. Each of the selection circuits S1 to S6 is configured to output a signal by switching an input signal in accordance with whether a signal Signal for selecting input data is 0 or 1. If Signal is 0, the signals input to the processing unit 1221 are output intact. If Signal is 1, the signals input to the two upper input terminals of the processing unit 1221 are output from the selection circuits S3 and S4, and the signals which are input to the two lower input terminals immediately before latching by latches D1 and D2 are output from the selection circuits S1 and S2. That is, if Signal is 1, Data2 is adjusted with respect to the data at the immediately preceding time point, and output as Data3. Signal is a signal which is set to 1 when adjustment of data is necessary in the error correction processing unit 122. After the total number of pixels read out from the image capturing apparatus 1, the error-correcting code length, and the like are determined, the value of Signal is accordingly controlled to be 0 or 1. Signal (1 or 0) is a signal used to perform adjustment so that the number of bytes (to be referred to as the number of parallel input data hereinafter) of data parallelly input to the error correction circuit 1222 and the number of bytes (to be referred to as an error-correcting code length hereinafter) of an error-correcting code do not have the relationship, number of parallel input data<error-correcting code length. In other words, when the error correction circuit generates an error-correcting code, it performs calculation in a plurality of cycles, and the length of data to be calculated in one cycle at this time is set as the number of parallel input data. When the length of an error-correcting code at this time is set as the error-correcting code length, an error-correcting code can be generated suitably by performing adjustment so as to satisfy the above relationship.

The error correction circuit 1222 generates an error-correcting code for Data3. In this example, the length of the data is represented using bytes as the unit of the length of the data. An error-correcting code may be calculated based on the above condition using "bits" as the unit of the length. Alternatively, the unit can be determined appropriately by, for example, setting 16 bits as one word. A predetermined length (bit count) may be regarded as one data unit. The fact that an error-correcting code is generated suitably by preventing the relationship "number of parallel input data<error-correcting code length" from being satisfied will be described later.

The length of the error-correcting code is determined by a generating polynomial used to generate the error-correcting code. When the generating polynomial is determined, the length of the error-correcting code is uniquely determined. Furthermore, the number of bytes of pixel data as an error correction target is uniquely determined when the number of pixels to be read out and the number of bits to be output at the time of A/D conversion are determined. FIG. 9 shows an example in which the 4-byte error-correcting code is added to the 28-byte pixel data. However, as will be described later, it may be necessary to add a 4-byte error correcting code to 14-byte pixel data in accordance with the number of pixels of the pixel region 10. In either case, a case in which it is inconvenient to generate an error-correcting code can be determined in accordance with the number of error correction target pixels read out from the pixel region 10, the error-correcting code length, and the number of parallel input data in processing for adding the error-correcting code. That is, the number of parallel input data is known in accordance with the length of data to which the error-correcting code is to be added, the error-correcting code length, and the length of data to be processed at once. Therefore, if it is inconvenient to generate an error-correcting code, the length of data input to the error correction circuit 1222 can be controlled by setting Signal to 1 at a predetermined time point. Note that in this embodiment, the number of parallel input data indicates the number of bytes of data parallelly input to the error correction circuit 1222 and processed at once. In other words, in this embodiment, the number of parallel input data indicates the number of data in units of bytes as calculation targets in one cycle of calculation when calculation is performing parallelly for parallelly input data and this processing is repeated for several cycles to finally generate an error-correcting code for all the data. Alternatively, the number of parallel input data can be said to be a number indicating the number of data in units of bytes which are parallelly input to the error correction circuit 1222. If the data unit is byte, when data of 6-byte data in units of bytes are parallelly input to the error correction circuit 1222, the number of parallel input data is six.

In the image capturing apparatus 1, a timing of setting Signal to 1 can be generated based on the digital data read out from the pixel region 10 and readout timing information, and the structure of data for which an error-correcting code is to be generated can be adjusted so as to be advantageous in generating the error-correcting code. Since the number of pixels, the error-correcting code length, and the like are known, the timing can also be provided from the outside of the image capturing apparatus 1 in accordance with the data readout mode from the pixel region 10. This operation will be described in detail below. Note that since the number of parallel input data is associated with a calculation speed at which the error-correcting code is calculated, an appropriate value can be set in accordance with the calculation speed, the number of pixels of the data, and the readout speed. In this embodiment, the largest value of the number of parallel input data is set to six for the sake of explanation.

This embodiment will exemplify a case in which the error-correcting code length is 4 bytes. Note that in the explanation of this embodiment, when "(number of parallel input data)<(error-correcting code length)" is satisfied, Signal is set to 1. As described above, however, a case in which a state of satisfying "(number of parallel input data)<(error-correcting code length)" occurs can be known before reading out the data from the pixel region 10. Therefore, the number of parallel input data can be adjusted by appropriately grouping the data, to which the error-correcting code is to be added, so as to prevent the state of satisfying "(number of parallel input data)<(error-correcting code length)" from occurring.

Figure 8:
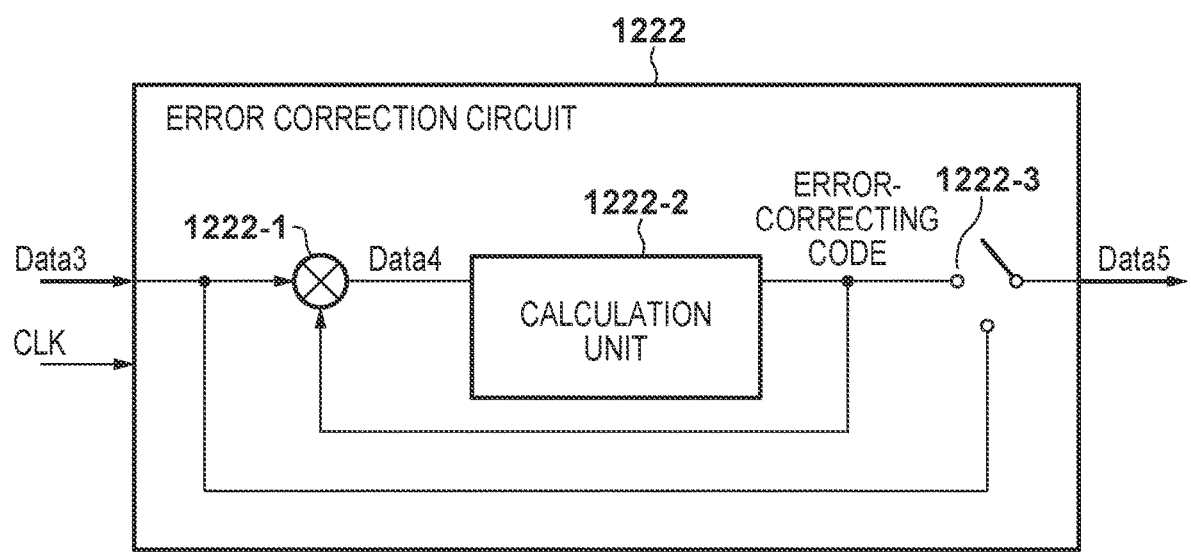
FIG. 8 is a block diagram showing an error correction circuit 1222 according to the first embodiment.

FIG. 8 is a block diagram of the error correction circuit 1222 for parallelly input data. A calculation unit 1222-2 calculates an error-correcting code for input Data4. The calculated error-correcting code is output as an error-correcting code from the calculation unit 1222-2. The error-correcting code output from the calculation unit 1222-2 after all the data of Data3 to which the error-correcting code is to be added are input to the calculation unit 1222-2 is set as an error-correcting code for Data3. Before calculation of all the data ends, Data3 input to the error correction circuit 1222 undergoes exclusive OR calculation with the error-correcting code output from the calculation unit 1222-2 in an exclusive OR circuit 1222-1. In an initial state as a state in which no error-correcting code is calculated, Data3 is directly output as Data4. The error-correcting code and Data3 are selected by a switch 1222-3 and output from the error correction circuit 1222. Following Data3, the generated error-correcting code is added to Data3 and the thus obtained data is output as Data5 by the switch 1222-3.

FIG. 9 is a timing chart showing the operations of the processing unit 1221 and error correction circuit 1222 when the number of parallel input data is not adjusted. Data of 28 bytes in total formed from Byte11 to Byte54 is input as Data2 to the error correction processing unit 122. At this time, 6 bytes of a group including Byte11, Byte12, Byte13, Byte14, Byte15, and Byte16 that are parallelly input are to be calculated in first cycle 0 defined by CLK. In each of cycles 1 to 3 as well, 6 bytes of each group are to be calculated (the number of parallel input data is 6 bytes). In cycle 4, a group of 4 bytes of Byte51 to Byte54 is to be calculated (the number of parallel input data is 4 bytes). Since the data included in the group in each cycle satisfies "(number of parallel input data)≥(error-correcting code length (4 bytes))", no adjustment is necessary, and Signal is always set to 0. As Data3, Data2 is output one cycle later. Data3 input to the error correction circuit 1222 undergoes exclusive OR processing with the error-correcting code in the exclusive OR circuit 1222-1, and resultant data is output as Data4.

Referring to FIG. 9, data represented by ByteXX' in Data4 indicates data obtained by calculating an exclusive OR of ByteXX of Data3 and the fed back error-correcting code by the exclusive OR circuit 1222-1. Data4 output from the exclusive OR circuit is input to the calculation unit 1222-2, and an error-correcting code is fed back to the exclusive OR circuit again, thereby generating an error-correcting code of Parity11 to Parity44 and Parity1 to Parity4. That is, as a result of inputting 28 bytes formed from Byte11' to Byte54', as indicated by Data4, to the calculation unit 1222-2, Parity1 to Parity4 are finally generated as an error-correcting code for Data2 formed from Byte11 to Byte54.

Briefly, as for the calculation method, in the first cycle, the remainder of 4 bytes output from the exclusive OR circuit and the remaining 2 bytes among 6 bytes is calculated by the generating polynomial. An exclusive OR of Parity11, Parity12, Parity13, and Parity14 obtained as the calculation result and Byte21, Byte22, Byte23, and Byte24 is obtained. As a result, Byte21', Byte22', Byte23', and Byte24' are obtained. In the next cycle, a remainder is calculated for 6 bytes of Byte21', Byte22', Byte23', and Byte24', and Byte25 and Byte26. Parity1 to Parity4 finally obtained by repeating the above processing are used as parity for the 28-byte data. In each cycle, calculation is performed for the parallelly input data, thereby speeding up generation of the error-correcting code.

Figure 10:
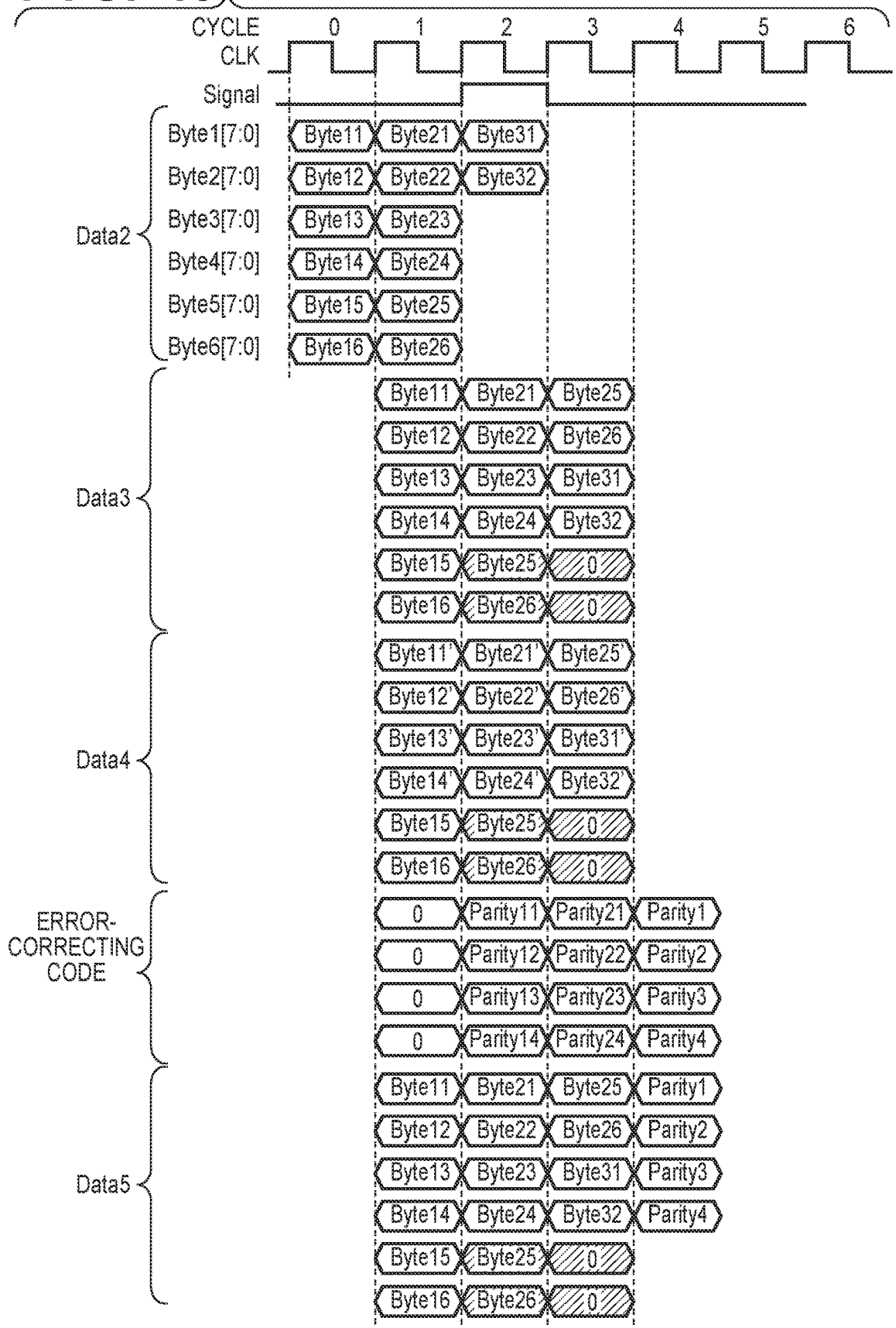
FIG. 10 is an example of a timing chart showing the operations of the processing unit 1221 and the error correction circuit 1222 according to the first embodiment.

An example of a case in which data unsuitable for generating an error-correcting code is given as Data2 will be described next with reference to FIG. 10. While Data2 shown in FIG. 5 is 28-byte data, Data2 shown in FIG. 10 is 14-byte data. Although Data2 shown in FIG. 5 is formed from 14-bit data of 16 pixels, if Data2 is formed from 14-bit data of 8 pixels, 14-byte Data2 shown in FIG. 10 is generated. The error-correcting code has been explained to be added for an arbitrary number of data bytes. Therefore, even if Data2 is 14-byte data, it is possible to calculate an error-correcting code. However, if 14-byte data is processed in the same manner as for 28-byte data, the number of data to be calculated in the last cycle for error correction is 2 bytes (the number of parallel input data=2). Therefore, the degree of a data polynomial is higher than that of the generating polynomial in the last cycle, a relationship of (number of parallel input data)<(error-correcting code length) is generated. Thus, it is impossible to generate an error-correcting code. In this case, by setting Signal to 1, Data3 advantageous in generating an error-correcting code is generated. Data Byte25 and Byte26 hatched in Data3 shown in FIG. 10 are arranged at the top of the third group, as shown in FIG. 10. The order of Byte11 to Byte32 remains unchanged. An overview of an operation after Data3 is the same as in the description of FIG. 9. In the example shown in FIG. 10, when Data2 as 14-byte data is input to the error correction processing unit 122, the data arrangement is adjusted by the processing unit 1221 as indicated by Data3. As a result, 6-byte data (Byte11 to Byte16) is input to the error correction circuit 1222 in the first cycle, 4-byte data (Byte21 to Byte24) is input to the error correction circuit 1222 in the next cycle, and 4-byte data (Byte25 to Byte32) is input to the error correction circuit 1222 in the last cycle.

A restriction on calculation of an error-correcting code can also be described as follows. If calculation operations each for 6 bytes are parallelly performed twice for 14-byte data, data included in a group of the last cycle of the calculation is 2-byte data. In this case, in calculation in the exclusive OR circuit 1222-1, 2-byte data is input in the last cycle while a 4-byte error-correcting code is to be added. At this time, in the exclusive OR circuit 1222-1, the numbers of bytes of the two data to be calculated, that is, the numbers of bytes of the input data (2 bytes) and the fed back parity (4 bytes), do not match each other. Therefore, no correct calculation is performed. To cope with this, Data3 is generated in the processing unit 1221 in accordance with the error-correcting code length and the number of parallel input data so that digital data satisfying "(number of parallel input data)<(error-correcting code length)" is not input to the error correction circuit 1222.

Figure 11:
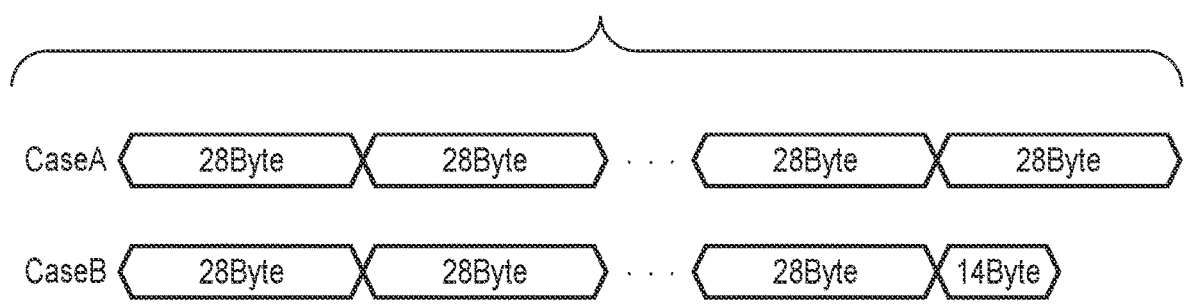
FIG. 11 is a view showing data for which an error-correcting code is to be generated.

FIG. 11 exemplifies two data strings represented by CaseA and CaseB. The data strings represented by CaseA and CaseB are examples of output of data read out from the pixel region and A/D-converted. A case in which a 4-byte error-correcting code is added to 28-byte data will be exemplified. Immediately before final calculation is performed, as for CaseA and CaseB, error correction calculation is performed for 28 bytes. However, in accordance with a difference in data amount read out from the pixel region, the final calculation is performed for 28 bytes in the case of CaseA and 14 bytes in the case of 14 bytes. As described above, if the largest number of parallel input data is six, a 4-byte error-correcting code is generated for 28-byte data without hindrance. However, for 14-byte data, the number of data included in each group needs to be adjusted. Thus, no adjustment is necessary for data like CaseA but adjustment is necessary for data like CaseB. The case of CaseA does not always occur depending on the amount of data read out from the pixel region 10 of the image capturing apparatus 1, and the case of CaseB may occur. In the case of CaseB, it is possible to generate an error-correcting code even in an image capturing apparatus different in number of pixels, by adjusting the number of data (the number of parallel input data) in each of a plurality of groups forming data as an error correction target.

In summary, in the conventional technique, when performing calculation for a plurality of groups forming data, the amount of the data for which an error-correcting code is to be generated may be unsuitable for generating the error-correcting code. To the contrary, as in this embodiment, it is possible to eliminate unsuitability when generating an error-correcting code by adjusting the number of parallelly calculated data included in each group. More specifically, the number of parallelly processed data (the number of parallel input data) included in each group is adjusted based on the number of pixels of the pixel region, the number of conversion bits at the time of A/D conversion, the amount of data to which an error-correcting code is added, the error-correcting code length, and the like. As a result, data satisfying "(number of parallel input data)≥(error-correcting code length)" is always input to the error correction circuit 1222. Thus, it is possible to eliminate the restriction between the number of data (the number of parallel input data) included in a group and the number (error-correcting code length) of bytes of an error-correcting code, and generate an error-correcting code. Note that byte is used as a data unit. However, the data unit is not limited to byte, and a bit count may be used. The arrangement of the processing unit 1221 is not limited to the arrangement for performing 2-byte processing. It is only necessary to be able to execute adjustment of the number of data so as to satisfy "(number of parallel input data)≥(error-correcting code length)". Each function of the signal processing unit 12 can be implemented when a computer executes a program.

Second Embodiment

The first embodiment has explained the case in which even if the number of pixels of the pixel region varies in the full pixel readout mode, it is possible to add an error-correcting code to parallelly output data. Even if the number of bytes of data to which an error-correcting code is to be added changes, it is possible to adjust the number of data of each group in accordance with the change. There is another example in which the number of bytes of data to which an error-correcting code is to be added changes in an image capturing apparatus 1. This embodiment will describe that it is possible to cope with a case in which the number of bytes of data to which an error-correcting code is to be added changes.

Figure 12:
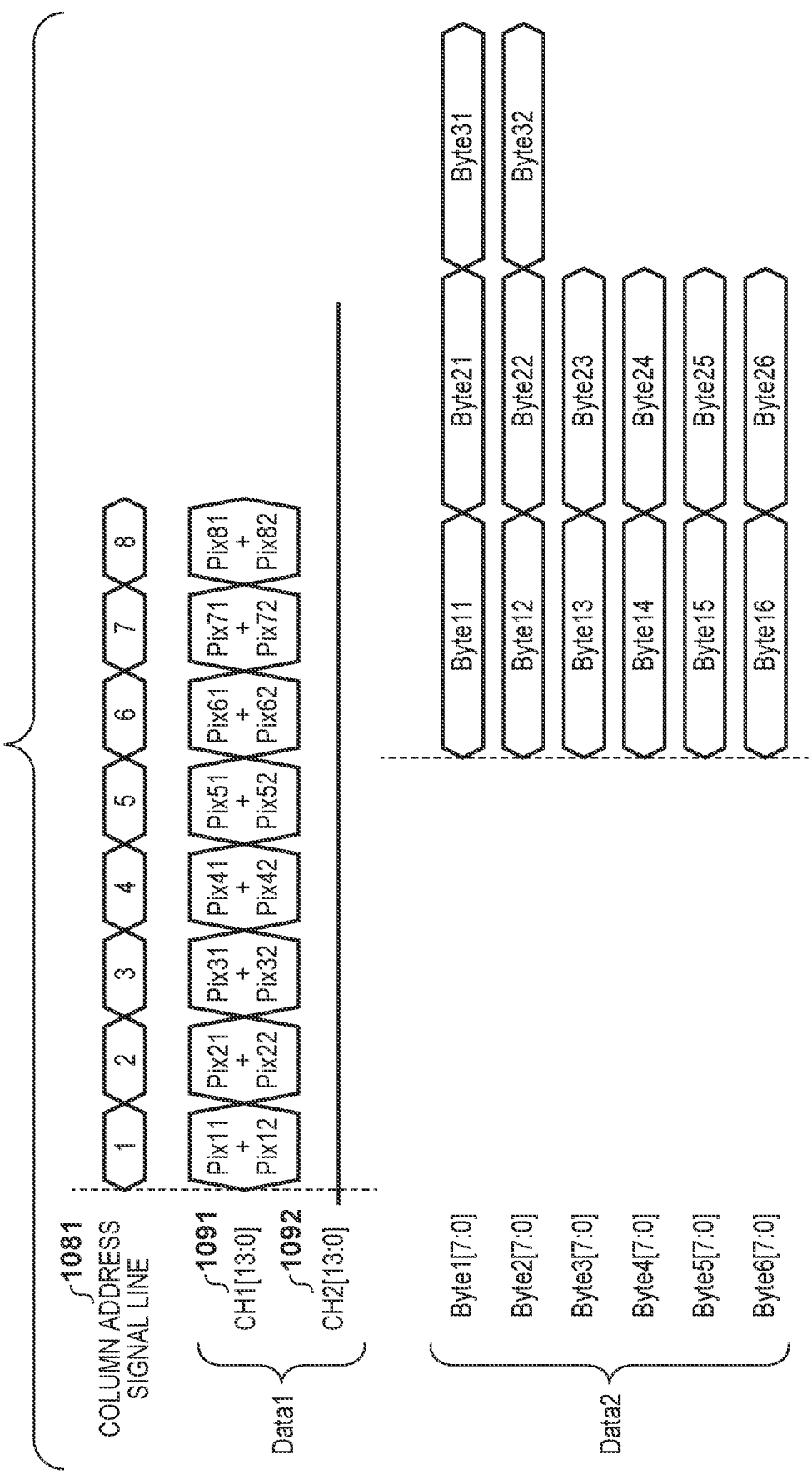
FIG. 12 is an example of a timing chart showing the operation of a bits to bytes conversion unit 121 according to the second embodiment.

In an arrangement shown in FIG. 2, as one of the readout methods of the pixel data of a pixel region 10, there is a binning mode as a method of binning data of a plurality of pixels 1021 and reading out them. In the binning mode, as for scanning in the vertical direction, each row is selected and read out, similarly to the full pixel readout mode. However, in the binning mode, a switch 103 of a readout circuit is turned on (closed state), and a switch 107 is turned off (open state). The signals of two pixels on the same row are binned by the switch 103, and output via an A/D converter 11 and a data holding unit 112 connected to one vertical output line 105. This embodiment will also describe a case in which there are two horizontal output lines. A column address signal line selects binned pixels. When a column address signal line 1081 is 1, data of Pix11 and Pix12 are binned and output to a horizontal output line 1091, and no pixel data is output to a horizontal output line 1092. Similarly, when the column address signal line 1081 is 2, pixel data of Pix21 and Pix22 are binned and output to the horizontal output line 1091, and no pixel data is output to the horizontal output line 1092. FIG. 12 shows the relationship between the column address signal line 1081 and Data1 at this time. By scanning the column address signal line 1081 in this way, it is possible to bin pixel data on a row designated by a row address signal line 1082, and read them out. In this example, pixel data are binned before conversion into digital data in the A/D converter 11. However, there is no problem even if binning of data may be performed in a calculating unit 123 of a signal processing unit 12. Even if there is no switch 103 or 107 in the pixel region 10, it is possible to bin pixel data by performing binning in the calculating unit 123. Furthermore, Data2 obtained as a result of converting Data1 shown in FIG. 12 into data in units of bytes is 14-byte data of Byte11 to Byte32, as shown in FIG. 12. This 14-byte data is to be added with a 4-byte error-correcting code.

Figure 13:
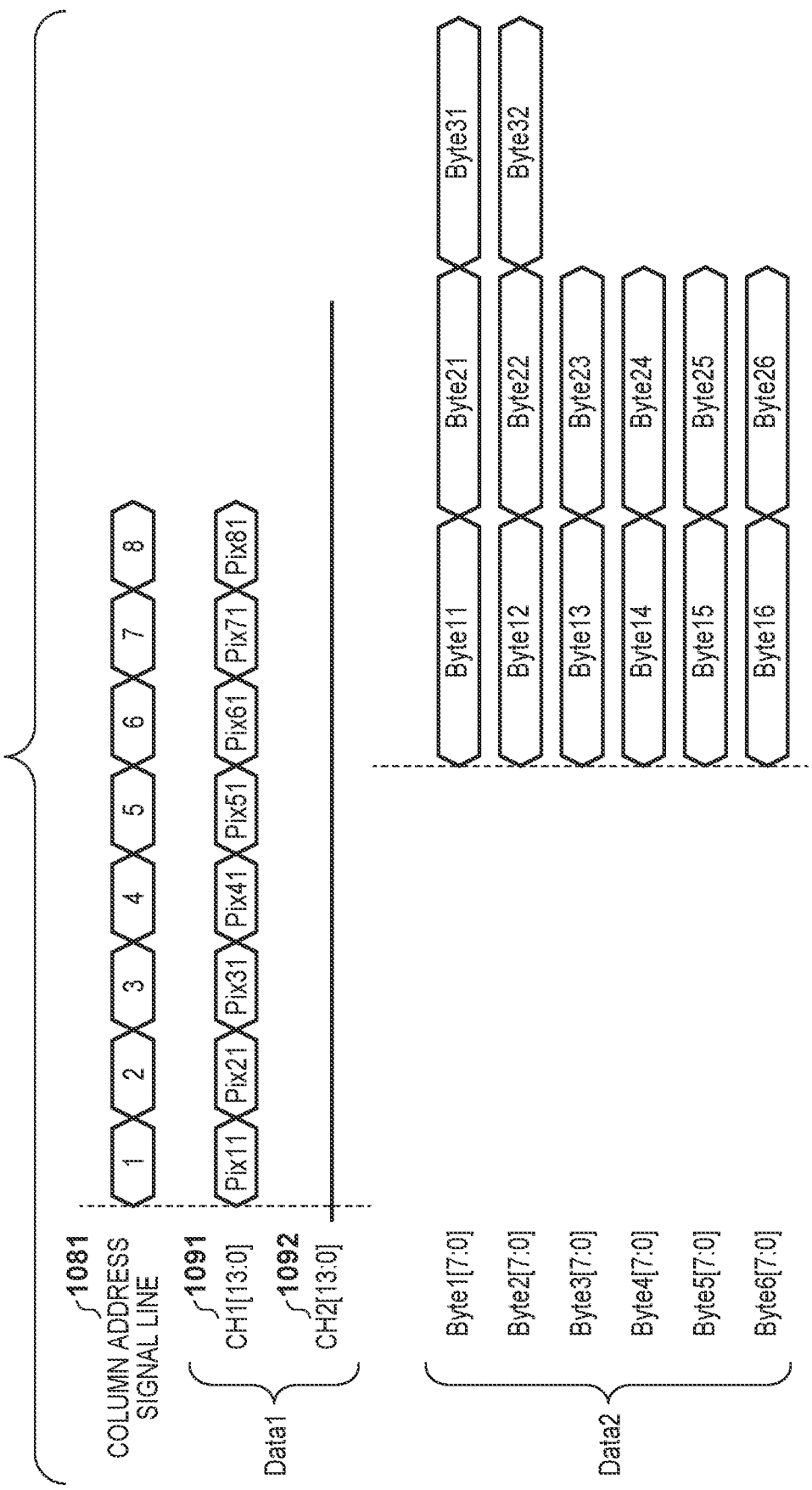
FIG. 13 is an example of a timing chart showing the operation of the bits to bytes conversion unit 121 according to the second embodiment.

In the arrangement shown in FIG. 2, as one of the readout methods of the pixel data of the pixel region 10, there is a thinning readout mode as a method of thinning data of the pixels 1021 and reading them out. Scanning in the vertical direction is the same as in the full pixel readout mode. In this method, the switch 103 is turned off (open state) and the switch 107 is turned off (open state). At this time, when the horizontal address is 1, data of Pix11 is output to the horizontal output line 1091, and no pixel data is output to the horizontal output line 1092. Similarly, when the column address signal line 1081 is 2, pixel data of Pix21 is output to the horizontal output line 1091, and no pixel data is output to the horizontal output line 1092. FIG. 13 shows the relationship between Data1 and the column address signal line 1081. By scanning the column address signal line 1081 in this way, it is possible to thin pixel data on a row designated by the row address signal line 1082, and read them out. The processing in this case can be executed in the calculating unit 123. When the calculating unit 123 performs the thinning processing, even if there is no switch 103 or 107 in the pixel region 10, the pixel data can be thinned by calculation. Data2 obtained as a result of converting Data1 shown in FIG. 13 into data in units of bytes is 14-byte data of Byte11 to Byte32, as shown in FIG. 13. In this embodiment, the pixels are thinned for every other pixel. However, the present invention is not limited to this, the thinning interval of the pixels may be arbitrary.

Figure 14:
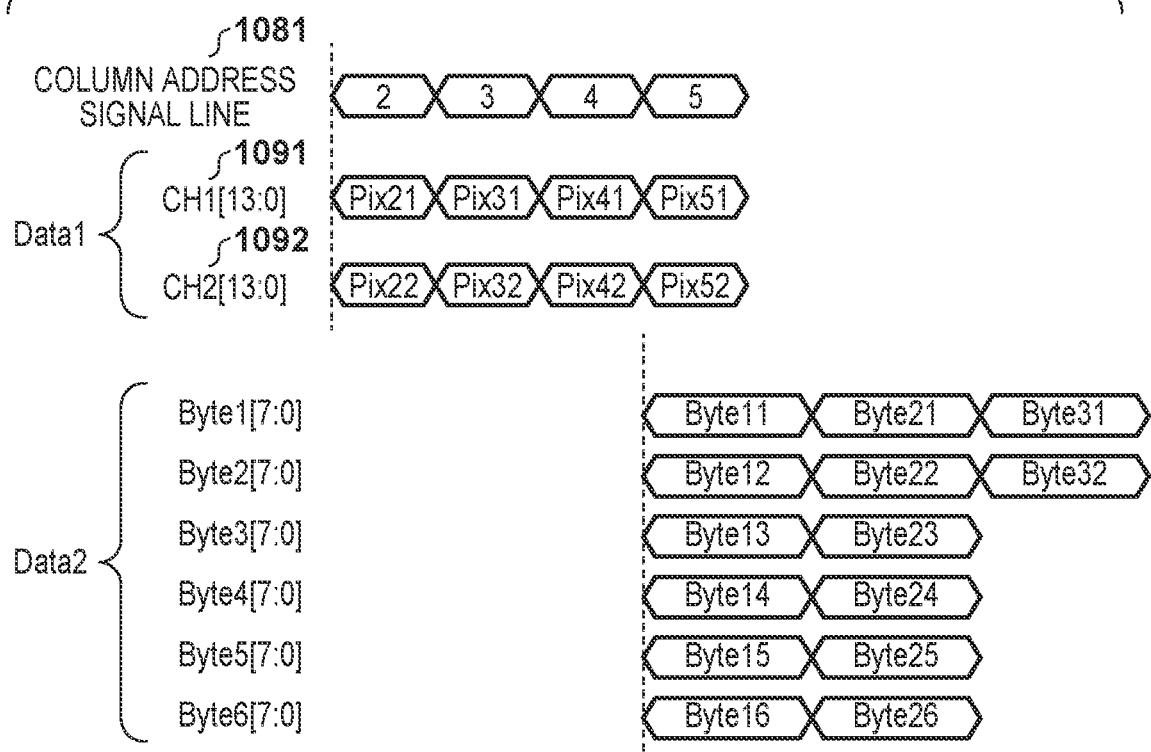
FIG. 14 is an example of a timing chart showing the operation of the bits to bytes conversion unit 121 according to the second embodiment.

In the arrangement shown in FIG. 2, as one of the readout methods of the pixel data of the pixel region 10, there is an extraction mode as a method of extracting an arbitrary region of the pixel region 10 and reading out data of the pixels 1021 included in the extracted region. Scanning in the vertical direction is the same as in the full pixel readout mode. In this method, the switch 103 is turned off (open state) and the switch 107 is turned on (closed state). At this time, an address from which a readout operation starts is designated as a horizontal address. For example, the horizontal address is operated from 2. When the horizontal address is 2, data of Pix21 is output to the horizontal output line 1091, and pixel data of Pix22 is output to the horizontal output line 1092. Similarly, the column address signal line 1081 is scanned sequentially from 3. By not scanning the column address signal line 1081 from 1, it is possible to extract a specific region and output data without reading out Pix11 and Pix12. FIG. 14 shows the relationship between Data1 and the column address at this time. In FIG. 14, 14-byte data converted in units of bytes is represented by Data2. The horizontal address and the column address signal line 1081 can be set from a desired position at which data is to be read out. Similarly, control by the row address signal line 1082 can also be performed. The amount of extracted data varies by designating an address at which a signal is to be read out.

In the examples shown in FIGS. 12 to 14, Data2 is 14-byte data. If the error-correcting code length is 4 bytes, as described in the first embodiment, when calculation is performed for first 12 bytes by setting the number of parallel input data to six, the relationship "(number of parallel input data)<(error-correcting code length)" is satisfied in the last cycle. Thus, to eliminate unsuitability before calculation, the number of data of each group is adjusted, and the data is then input to the error correction circuit 1222. An error-correcting code generation method is the same as in the first embodiment. If the readout mode of the image capturing apparatus 1 is changed, as described above, the number of bytes of data for which an error-correcting code is to be generated may change. According to the present invention, even in the above-described case, it is possible to generate an error-correcting code without unsuitability.

Figure 15:
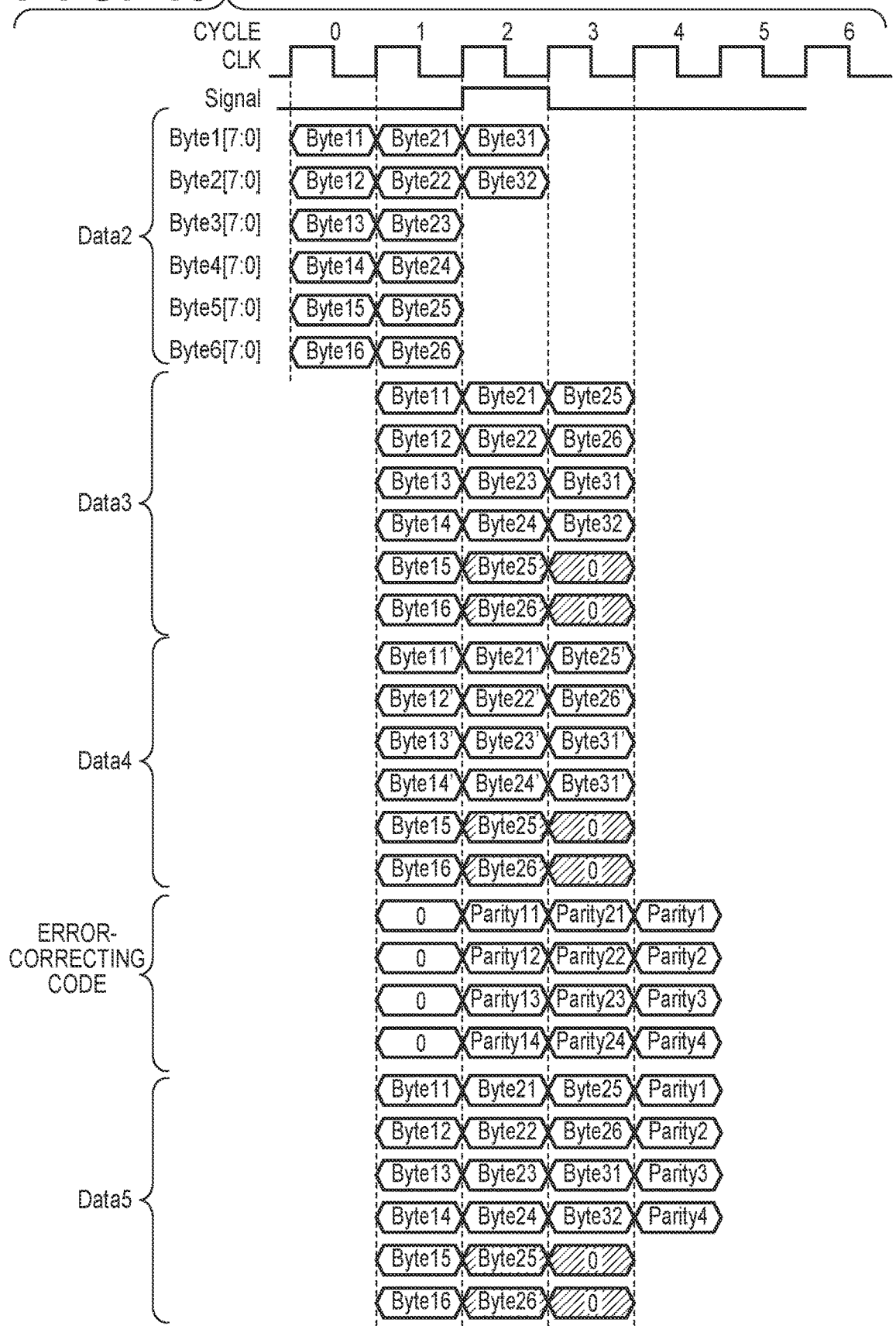
FIG. 15 is an example of a timing chart showing the operations of a processing unit 1221 and an error correction circuit 1222 according to the second embodiment.

FIG. 15 shows the relationship among Data2 to Data5 when the number of data included in each group of Data2 shown in each of FIGS. 12 to 14 is adjusted. The number of data included in each group is adjusted to 4 bytes or more in all cycles of Data3 input to the error correction circuit 1222. As a result, the relationship "(number of parallel input data)≥(error-correcting code length)" is satisfied, and it is thus possible to generate an error-correcting code without unsuitability.

Third Embodiment

A case in which a moving image capturing mode or a still image capturing mode is switched in the arrangement described in the first embodiment will be considered. In this case, when an A/D converter 11 converts a signal from a pixel into a digital signal, the number of bits converted for each pixel needs to be changed. For example, the A/D converter 11 changes the number of bits for each pixel, for example, converts data into 14-bit data for each pixel in the still image capturing mode, and converts data into 10-bit data for each pixel in the moving image capturing mode. At this time, the amount of data for which an error-correcting code is to be generated changes. Thus, data satisfying "(number of parallel input data)<(error-correcting code length)" may be input to an error correction circuit 1222. In this case as well, it is possible to generate an error-correcting code without unsuitability by adjusting the number of data included in each group so that the number of parallel input data satisfies the condition.

Fourth Embodiment

Figure 16:
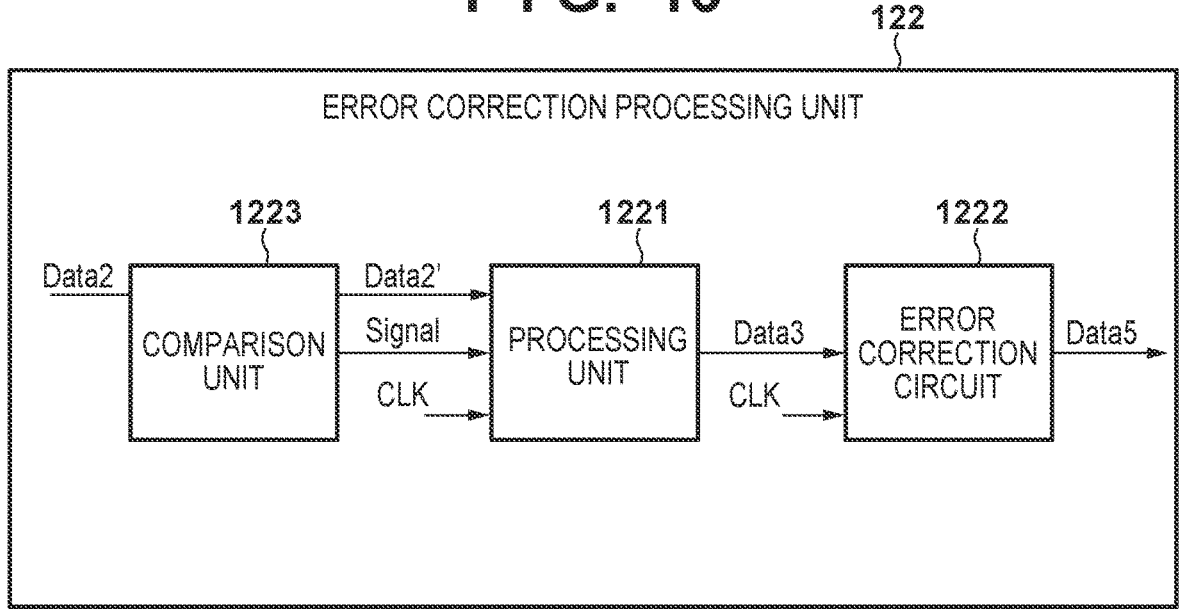
FIG. 16 is a block diagram showing an error correction processing unit 122 according to the fourth embodiment.

This embodiment will describe an example in which the error correction processing unit 122 adjusts the number of data included in each group input to an error correction circuit 1222 by determining the length of input Data2. FIG. 16 shows the arrangement of the error correction processing unit 122 according to this embodiment. The arrangement of the error correction processing unit 122 is different from the first embodiment in that the error correction processing unit 122 includes a comparison unit 1223 for detecting the end of Data2. The comparison unit 1223 can detect the end of data. The comparison unit 1223 detects the data length of Data2 by detecting the end, and delays Data2 to output it as Data2'. The comparison unit 1223 determines based on the detected data length whether it is necessary to adjust the number of data when inputting the data to the error correction circuit 1222. Since the error-correcting code length has a predetermined numerical value, the comparison unit 1223 determines the data length, and compares the number of bytes of the error-correcting code with the number of parallel input data, thereby generating Signal that instructs a processing unit 1221 to perform adjustment. The processing unit 1221 can adjust the number of data (the number of parallel input data) of the group in accordance with Signal. There is provided a method of determining the data length by adding, to the end of the data to which the error-correcting code is to be added, data called EndCode indicating the end of data. The data EndCode is added to the end of the data for which an error-correcting code is to be generated when the data is input to the error correction processing unit 122. More specifically, the error correction processing unit 122 adds EndCode based on information about the length of externally provided data. The error correction processing unit 122 generates Signal in accordance with the timing of generating EndCode and input of EndCode. An example of an operation when controlling the number of parallel input data based on EndCode will be described below.

Figure 17:
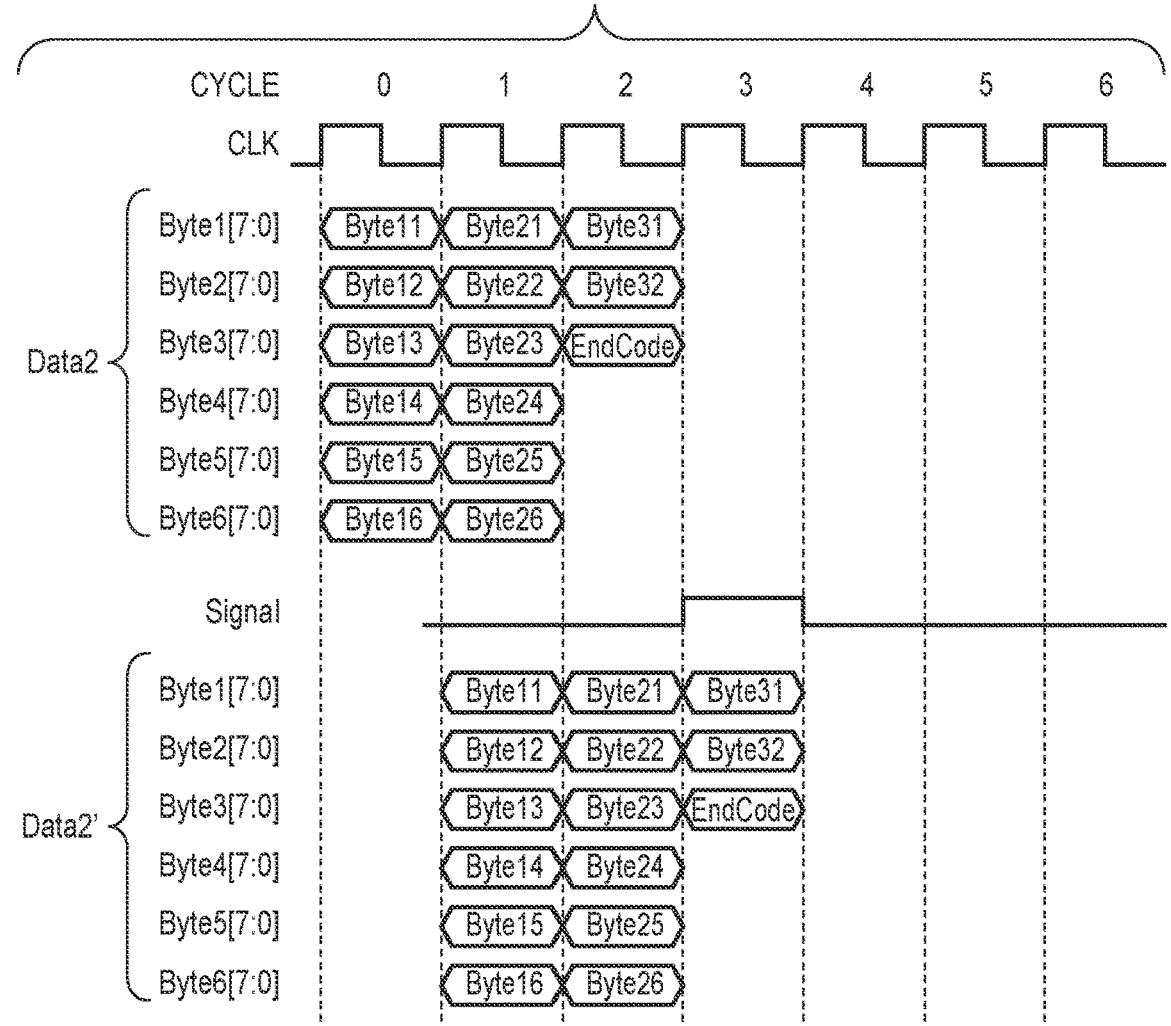
FIG. 17 is an example of a timing chart showing the operation of a comparison unit 1223 according to the fourth embodiment.

FIG. 17 is a timing chart showing an operation in the comparison unit 1223. Consider a case in which the same data as Data2 shown in FIG. 15 is input to the comparison unit 1223. At this time, EndCode is added to the end of the data as a target of an error-correcting code. The comparison unit 1223 determines the data length by detecting the beginning of the data, and then detecting EndCode, and it is recognized that the number of parallel input data in the last cycle is 2 bytes of Byte31 and Byte32. At this time, it is possible to detect that the number of parallel input data needs to be adjusted by comparing the number of parallel input data which is 2 with the number of bytes of the error-correcting code which is 4. The comparison unit 1223 delays Data2 to output it, thereby generating Data2'. The phase of last 2 bytes of Data2' output from the comparison unit 1223 and the phase of Signal for instructing adjustment match each other, as shown in FIG. 17. Based on Signal and Data2' output from the comparison unit 1223, the processing unit 1221 adjusts the number of parallel input data included in each group of Data2'. This embodiment is different from the first embodiment in that the error correction processing unit 122 determines the data length from the input data, and controls the number of parallel input data. With this arrangement, the error correction processing unit 122 can determine adjustment of the number of data of each group and control the number of data. Thus, an instruction from the outside becomes unnecessary, and it is possible to perform flexible control in accordance with the data length.

Figure 18:
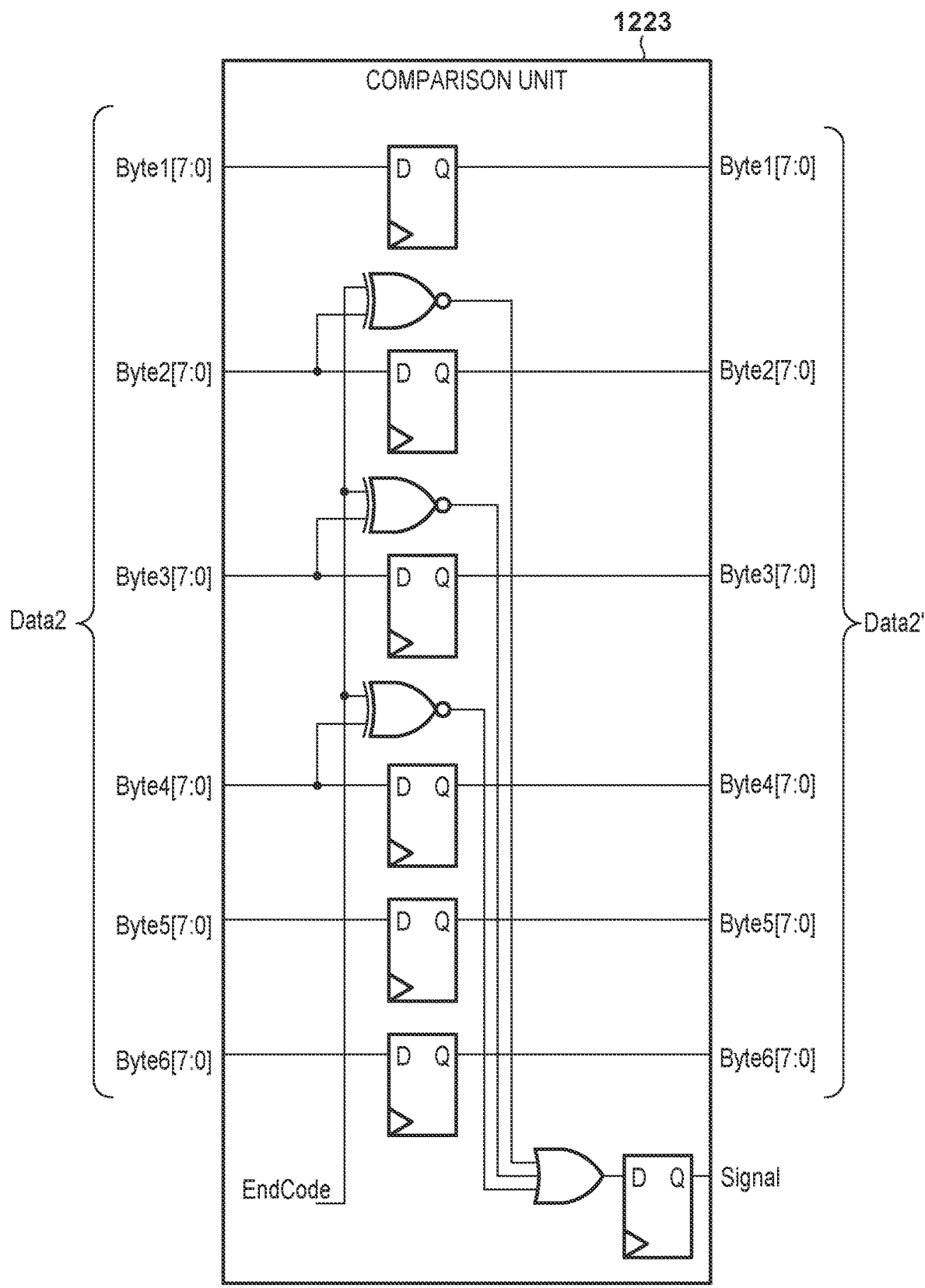
FIG. 18 is a circuit diagram showing the comparison unit 1223 according to the fourth embodiment.

FIG. 18 shows an example when the comparison unit 1223 is formed from hardware. If the error-correcting code length is 4 bytes, when the number of parallel input data in the last cycle is 1 to 3, "(number of parallel input data)≥ (error-correcting code length)" is not satisfied. That is, it is necessary to set Signal to 1 when data is input to only Byte1, when data is input to only Byte1 and Byte2, and when data is input to only Byte1 to Byte3. In each case, EndCode is in Byte2, Byte3, or Byte4 immediately succeeding the data. Therefore, if EndCode is input to Byte2, Byte3, or Byte4, the comparison unit 1223 is configured to detect EndCode and to output Signal.

As described above, in the example of the arrangement according to this embodiment as well, the number of parallel input data is adjusted in accordance with a data amount, and thus data satisfying "(number of parallel input data)≥(error-correcting code length) is input to the error correction circuit 1222. Therefore, it is possible to generate an error-correcting code without any restriction between the number of pixel data and the error-correcting code length.

Even if the capturing mode changes, as in the second or third embodiment, it is possible to control adjustment of the number of parallel input data using a comparison unit by adding EndCode to the end of data, as described above, thereby generating an error-correcting code. In each of the above-described embodiments, each function of the signal processing unit 12 can be implemented when a computer executes a program.

Fifth Embodiment

FIG. 19 is a block diagram showing an example of the arrangement of an image capturing system 2. The image capturing system 2 includes, for example, an optical unit 210, an image capturing apparatus 1, an image signal processing unit 230, a recording/communication unit 240, a timing control unit 250, a system control unit 260, and a reproduction/display unit 270. An image capturing unit 220 includes the image capturing apparatus 1 and the image signal processing unit 230. As the image capturing apparatus 1, the image capturing apparatus 1 described in the above embodiment is used.

The optical unit 210 as an optical system such as a lens forms an image of an object by forming light from the object into an image in a pixel region 10 in which a plurality of pixels of the image capturing apparatus 1 are arranged in a matrix. The image capturing apparatus 1 outputs a signal corresponding to the light formed into the image in the pixel region 10 at a timing based on a signal from the timing control unit 250, and an error-correcting code corresponding to the signal. The output signal from the image capturing apparatus 1 is input to the image signal processing unit 230, and the image signal processing unit 230 performs signal processing in accordance with a method defined by a program and the like. At this time, processing based on the error-correcting code is also performed. The signal obtained by the processing performed by the image signal processing unit 230 is sent as image data to the recording/communication unit 240. The recording/communication unit 240 sends a signal for forming an image to the reproduction/display unit 270 to make it reproduce/display a moving image or still image. The recording/communication unit 240 also communicates with the system control unit 260 upon receiving a signal from the image signal processing unit 230, and performs an operation of recording the signal for forming the image in a recording medium (not shown).

The system control unit 260 comprehensively controls the operation of the image capturing system, and controls the driving of the optical unit 210, the timing control unit 250, the recording/communication unit 240, and the reproduction/display unit 270. The system control unit 260 includes a storage device (not shown), for example, a recording medium, and records programs and the like necessary to control the operation of the image capturing system. In addition, the system control unit 260 supplies, for example, a signal for switching a driving mode in accordance with the operation of the user into the image capturing system. Practical examples of the signal are a signal for changing a row to be read out or reset, a signal for changing a field angle accompanying an electronic zooming operation, and a signal for shifting a field angle accompanying an electronic anti-vibration operation. The timing control unit 250 controls the driving timings of the image capturing apparatus 1 and the image signal processing unit 230 under the control of the system control unit 260.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-246405, filed Dec. 22, 2017, which is hereby incorporated by reference herein in its entirety.

What is claimed is:

1. An image capturing apparatus comprising:
a pixel region in which a plurality of pixels are arranged in a matrix;
an A/D converter configured to convert a plurality of signals output from the plurality of pixels into a plurality of corresponding digital data; and
a signal processing unit configured to generate an error-correcting code for the plurality of digital data,
wherein, in the generating the error-correcting code, the signal processing unit performs grouping of the plurality of digital data output from the A/D converter into a plurality of groups, and
wherein the signal processing unit performs the grouping so that, in each of the plurality of groups, a total data length of the digital data forming a corresponding one of the plurality of groups is not shorter than a length of the error-correcting code.

2. The apparatus according to claim 1, wherein
the signal processing unit sequentially performs, for the plurality of groups, calculation for generating the error-correcting code, and
performs the grouping so that the data length of one group processed at least one group before the group for which calculation is performed last is shorter than the data length of one of the precedingly processed groups and is not shorter than the length of the error-correcting code.

3. The apparatus according to claim 1, wherein the grouping is performed not to change an order of the plurality of digital data.

4. The apparatus according to claim 1, further comprising:
a readout circuit configured to read out the signals from the pixel region,
wherein the readout circuit reads out the signals from the pixel region in a binning mode.

5. The apparatus according to claim 1, further comprising:
a readout circuit configured to read out the signals from the pixel region,
wherein the readout circuit reads out the signals from the pixel region in a thinning readout mode.

6. The apparatus according to claim 1, further comprising:
a readout circuit configured to read out the signals from the pixel region,
wherein the readout circuit reads out signals of a predetermined region of the pixel region.

7. The apparatus according to claim 1, wherein the signal processing unit adds a code indicating an end of data to an end of the plurality of digital data.

8. The apparatus according to claim 7, wherein the signal processing unit groups the plurality of digital data in response to detection of the code indicating the end of the data.

9. The apparatus according to claim 8, wherein the signal processing unit determines a length of the plurality of digital data in response to the detection.

10. The apparatus according to claim 1, wherein the signal processing unit generates the error-correcting code by performing calculation operations for the grouped data parallelly.

11. An image capturing system comprising:
an image capturing apparatus defined in claim 1; and an image signal processing unit configured to process an output signal from the image capturing apparatus.

12. A signal processing apparatus comprising a signal processing unit configured to generate an error-correcting code for a plurality of digital data obtained by photoelectric conversion, wherein, in the generating the error-correcting code, the signal processing unit performs grouping of the plurality of digital data into a plurality of groups, and wherein the signal processing unit performs the grouping so that, in each of the plurality of groups, a total data length of the digital data forming a corresponding one of the plurality of groups is not shorter than a length of the error-correcting code.

13. The apparatus according to claim 12, wherein the signal processing unit sequentially performs, for the plurality of groups, calculation for generating the error-correcting code, and performs the grouping so that the data length of one group processed at least one group before the group for which calculation is performed last is shorter than the data length of one of the precedingly processed groups and is not shorter than the length of the error-correcting code.

14. The apparatus according to claim 12, wherein the grouping is performed not to change an order of the plurality of digital data.

15. A signal processing method of generating an error-correcting code for a plurality of digital data obtained by photoelectric conversion, the method comprising:

in the generating the error-correcting code, grouping the plurality of digital data into a plurality of groups, wherein the grouping is performed so that, in each of the plurality of groups, a total data length of the digital data forming a corresponding one of the plurality of groups is not shorter than a length of the error-correcting code.

* * * * *